US008035859B2

(12) United States Patent
Kusunoki

(10) Patent No.: US 8,035,859 B2

(45) Date of Patent: Oct. 11, 2011

(54) IMAGE FORMING SYSTEM, IMAGE FORMING APPARATUS AND DENSITY CORRECTION METHOD

(75) Inventor: Hideyuki Kusunoki, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 884 days.

(21) Appl. No.: 12/028,857

(22) Filed: Feb. 11, 2008

(65) Prior Publication Data

US 2008/0218778 A1 Sep. 11, 2008

(30) Foreign Application Priority Data

Mar. 9, 2007 (JP) ................................. 2007-060191

(51) Int. Cl.
*H04N 1/40* (2006.01)
*G06F 15/00* (2006.01)
*G03F 3/08* (2006.01)
*G03G 15/00* (2006.01)

(52) U.S. Cl. ....... 358/3.01; 358/1.9; 358/3.22; 358/521; 399/49

(58) Field of Classification Search ........................ None
See application file for complete search history.

(56) References Cited

U.S. PATENT DOCUMENTS 5,566,372 A 10/1996 Ikeda et al.
5,877,787 A * 3/1999 Edge .............................. 347/19
6,243,542 B1 * 6/2001 Fujimoto et al. ................ 399/49
6,982,812 B2 * 1/2006 Johnson ......................... 358/1.9
7,012,716 B2 * 3/2006 Furuya ........................... 358/3.1
7,233,749 B2 * 6/2007 Yoshizuka et al. .............. 399/49
7,257,336 B2 * 8/2007 Narimatsu et al. .............. 399/30
7,551,315 B2 * 6/2009 Hoshii et al. ................... 358/1.2
2002/0067494 A1 * 6/2002 Furuya ........................... 358/1.9
2002/0118976 A1 * 8/2002 Fischer ........................... 399/49
2002/0141769 A1 10/2002 Phillips (Continued)

FOREIGN PATENT DOCUMENTS

JP 07-264411 10/1995

(Continued)

OTHER PUBLICATIONS

Notification of Reason of Refusal; Japanese Patent Application No. 2007-060191, Reference No. P170063BAE; Dispatched Mar. 3, 2009.

(Continued)

*Primary Examiner* — David K Moore
*Assistant Examiner* — Barbara Reinier
(74) *Attorney, Agent, or Firm* — Banner & Witcoff, Ltd

(57) ABSTRACT

An image forming system, image forming apparatus, and method of correcting image density are provided. The system includes a forming unit that forms an image; an acquisition unit that acquires factor information corresponding to a factor which is capable of causing variations in density of the image; a first determination unit that determines a number of marks in accordance with the factor information; a control unit that provides the forming unit with, as the image data, data pertaining to a pattern comprising a plurality of density marks which are different from each other in density and which are equal in number to the number of marks; a detection unit that detects a density of the image formed on the target by the forming unit in relation to the pattern; and a correction unit that corrects the density of the image in accordance with a result of the detection.

19 Claims, 7 Drawing Sheets

U.S. PATENT DOCUMENTS

| | | | | |
|---|---|---|---|---|
| 2002/0181018 | A1* | 12/2002 | Hung | 358/1.15 |
| 2003/0109998 | A1* | 6/2003 | Lorenz et al. | 702/85 |
| 2004/0114157 | A1* | 6/2004 | Linder et al. | 358/1.9 |
| 2004/0131371 | A1* | 7/2004 | Itagaki et al. | 399/49 |
| 2004/0136025 | A1* | 7/2004 | Moriyama et al. | 358/1.14 |
| 2005/0117926 | A1 | 6/2005 | Tanaka et al. | |
| 2005/0117927 | A1* | 6/2005 | Tanaka et al. | 399/49 |
| 2005/0185227 | A1* | 8/2005 | Thompson | 358/474 |
| 2005/0206928 | A1* | 9/2005 | Itagaki | 358/1.9 |
| 2006/0171001 | A1* | 8/2006 | Kitagawa et al. | 358/521 |
| 2006/0285862 | A1* | 12/2006 | Sakamoto et al. | 399/49 |
| 2007/0140552 | A1* | 6/2007 | Fan et al. | 382/162 |
| 2009/0116073 | A1* | 5/2009 | Nakamura | 358/3.23 |
| 2009/0161127 | A1* | 6/2009 | Schweid et al. | 358/1.9 |

FOREIGN PATENT DOCUMENTS

| | | |
|---|---|---|
| JP | 2001-309178 | 11/2001 |
| JP | 2002-229278 | 8/2002 |
| JP | 2002-258573 | 9/2002 |
| JP | 2002-296851 | 10/2002 |

OTHER PUBLICATIONS

European Search Report issued in counterpart European Application No. 08 00 2561, mailed Jun. 21, 2010.

* cited by examiner

IMAGE FORMING SYSTEM, IMAGE FORMING APPARATUS AND DENSITY CORRECTION METHOD

CROSS-REFERENCE TO RELATED APPLICATION

This application claims priority from Japanese Patent Application No. 2007-060191, filed on Mar. 9, 2007, the entire subject matter of which is incorporated herein by reference.

TECHNICAL FIELD

Aspects of the present invention relate to an image forming system, an image forming apparatus, and a density correction method.

BACKGROUND

In an image forming apparatus, density reproducibility for faithfully reproducing the density of an image varies as a result of a developing performance of a developing unit. The developing performance of the developing unit is often deteriorated as a result of, for instance, repeated use of the image forming apparatus. Accordingly, some image forming apparatuses perform density correction processing at a predetermined timing. Related art density correction processing is performed by means of transferring a pattern consisting of a plurality of density marks of different densities onto, for example, a recording medium. A density sensor then detects the density of the thus-transferred pattern and adjusts densities of respective stages in accordance with results of the detection, thereby correcting the densities.

Japanese Patent Application JP-A-2001-309178 describes a related art technique intended for preventing excessive consumption of toner, or the like. According to the related art technique, during density processing, a simple pattern having a comparatively-smaller number of density marks is transferred onto a recording medium, and the density of the simple pattern is detected. The density of the simple pattern is compared to a previous density correction. If the density has changed only minimally, no action is taken. On the other hand, if the density has changed drastically as compared with the previously acquired density correction, a detailed pattern that is larger than the simple pattern in terms of the number of density marks is transferred onto the recording medium, and density correction then is performed in accordance with the detailed pattern.

However, the related art technique described by Japanese Patent Application No. JP-A-2001-309178 has some disadvantages. The related art technique requires many steps. This means the related art technique takes much time to complete, thus reducing the printing efficiency. Also, even when there is a high probability of a great change having arisen in density, processing pertaining to a plurality of steps including transferring a simple pattern, detecting the density of the simple pattern, transferring a detailed pattern, and detecting the density of the detailed pattern is performed indiscriminately, so that density correction processing is inefficient.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide an image forming system, an image forming apparatus, and a density correction method, which enable a more efficient correction of a density.

According to an exemplary embodiment of the present invention, there is provided an image forming system comprising an image forming apparatus, and an information processing apparatus which is configured to communicate with the image forming apparatus, the image forming system comprising a forming unit that forms an image on a target in accordance with image data; an acquisition unit that acquires factor information corresponding to a factor which is capable of causing variations in density of the image formed by the forming unit; a determination unit that determines a number of marks in accordance with the factor information acquired by the acquisition unit; a control unit that provides the forming unit with, as the image data, data pertaining to a pattern comprising a plurality of density marks which are different from each other in density and which are equal in number to the number of marks determined by the determination unit; a detection unit that detects a density of the image formed on the target by the forming unit in relation to the pattern; and a correction unit that corrects the density of the image in accordance with a result of detection performed by the detection unit.

According to another exemplary embodiment, there is provide an image forming apparatus comprising a forming unit that forms an image on a target in accordance with image data; an acquisition unit that acquires factor information corresponding to a factor which is capable of causing variations in density of the image formed by the forming unit; a determination unit that determines a number of marks in accordance with the factor information acquired by the acquisition unit; a control unit that provides the forming unit with, as the image data, data pertaining to a pattern comprising a plurality of density marks which are different from each other in density and which are equal in number to the number of marks determined by the determination unit; a detection unit that detects a density of the image formed on the target by the forming unit in relation to the pattern; and a correction unit that corrects the density of the image formed by the forming unit in accordance with a result of detection performed by the detection unit.

According to yet another exemplary embodiment of the present invention, there is provided a method for correcting density of an image formed on a target, the method comprising acquiring factor information corresponding to a factor capable of causing variations in density of the image; determining a number of marks in accordance with the factor information; forming, on the target, an image of a pattern comprising a plurality of density marks which are equal in number to the number of marks; detecting a density of the image based on the pattern comprising the plurality of density marks; and correcting the density in based on a result of detecting the density.

BRIEF DESCRIPTION OF THE DRAWINGS

The above and other aspects of the present invention will become more apparent and more readily appreciated from the following description of exemplary embodiments of the present invention taken in conjunction with the attached drawings, in which.

DETAILED DESCRIPTION

An exemplary embodiment of the present invention will be described by reference to FIGS. 1 through 10.

Overall Configuration of an Image Forming Apparatus

Figure 1:
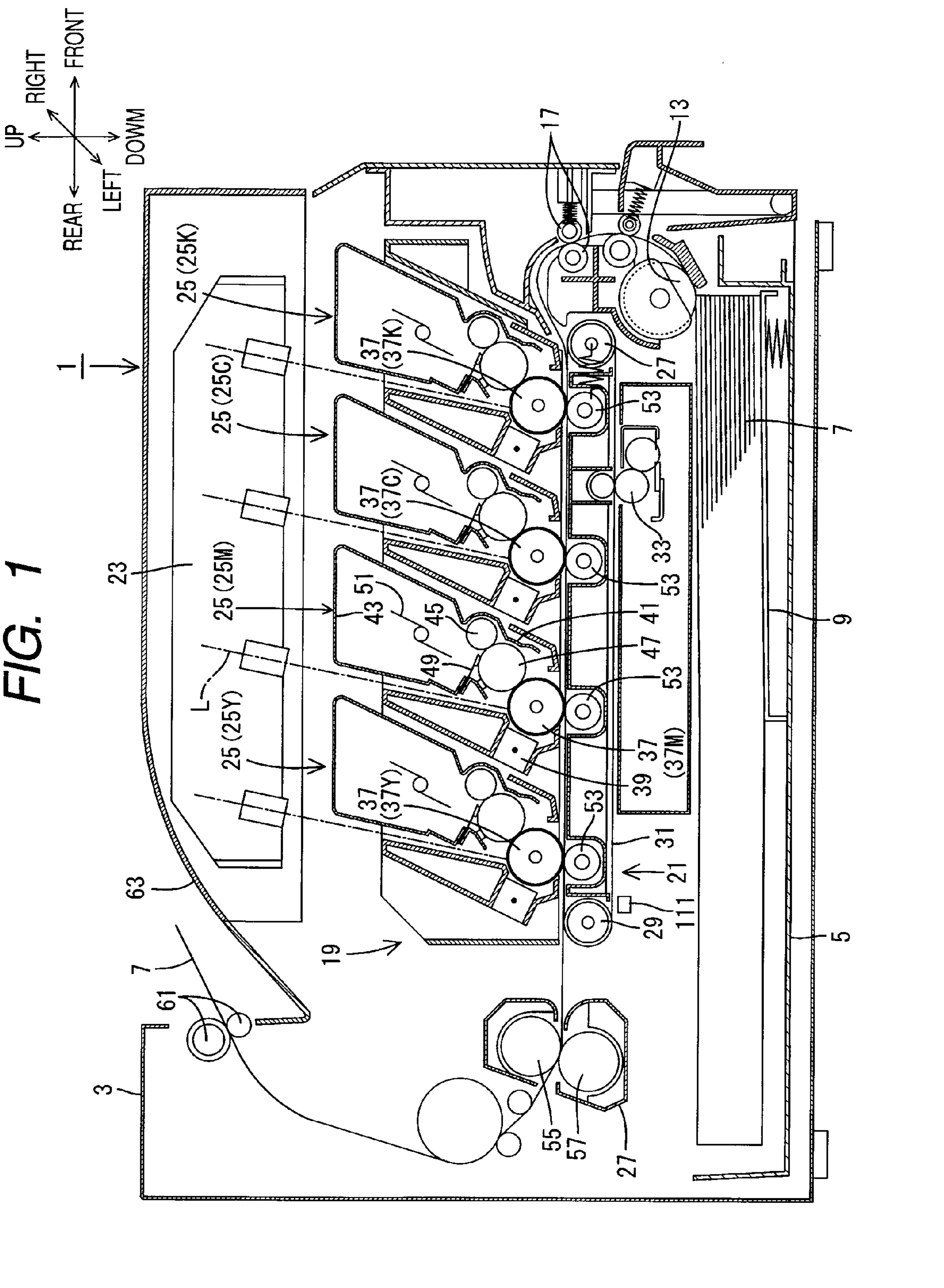
FIG. 1 is a side cross-sectional view showing a general configuration of an image forming apparatus according to an exemplary embodiment of the present invention.

FIG. 1 is a side cross-sectional view showing the general configuration of an image forming apparatus 1 according to an exemplary embodiment of the present invention. In the following descriptions, a right side (a rightward direction) of FIG. 1 is taken as a front side (a forward direction) of the image forming apparatus 1.

As shown in FIG. 1, the image forming apparatus 1 is, for example, a color laser printer of a direct transfer tandem type and has a casing 3. A feeding tray 5 is disposed at the bottom of the casing 3, and a recording medium (e.g., a sheet material such as sheets) 7 is loaded in the feeding tray 5.

The recording medium 7 is pushed toward a pickup roller 13 by means of a pressing plate 9 and sent to a registration roller 17 by means of rotation of the pickup roller 13. After correcting skewed travel of the recording medium 7, the registration roller 17 sends the recording medium 7 onto a belt unit 21 at a predetermined timing.

The image forming section 19 comprises a belt unit 21 (an example of a conveyance unit), a scanner section 23 (an example of an exposure unit), a processing section 25, and a fixing unit 27. In the exemplary embodiment, the scanner section 23 and the processing section 25 comprise an example of a "forming unit."

The belt unit 21 comprises an endless belt 31 (an example of a target) passed between a pair of support rollers 27 and 29. The belt 31 moves, in a circulating manner, in a counterclockwise direction in FIG. 1 as a result of rotational driving of, e.g., the rear support roller 29, whereupon the recording medium 7 loaded on the belt 31 is conveyed rearwardly.

A cleaning roller 33 for eliminating toner adhering to the belt 31 (including a density patch P and an additional patch A which will be described later), paper dust, and the like, is provided at a lower side of the belt unit 21.

The scanner section 23 has a laser emission section (not shown) whose activation and deactivation are controlled in accordance with image data, and performs high-speed scanning while emitting laser beams L for respective color images to surfaces of photosensitive drums 37 assigned to the respective colors.

The processing section 25 comprises a plurality of four processing sections which correspond to respective colors, for example black, cyan, magenta, and yellow. The respective processing sections 25 are made identical in configuration to each other except for colors of the toner (example coloring agents), or the like, used in each. In parts of the description where it is helpful to distinguish the individual processing sections from each other in terms of colors in the following descriptions, the processing sections are indicated by subscripts K (black), C (cyan), M (magenta), and Y (yellow) In parts of the description which follows where it would be cumbersome to refer to the individual processing sections, the subscripts are omitted.

Each of the processing sections 25 comprises a photosensitive drum (an example of an image carrier or a photosensitive element) 37, an electrifier 39, a developing cartridge 41, and the like.

Each of the developing cartridges 41 comprises a toner storage chamber 43, a supply roller 45, a developing roller 47 (an example of a developing agent carrier), and a layer thickness regulation blade 49 (an example of a layer thickness regulation unit).

Toner is supplied to the developing roller 47 by means of rotation of an agitator 51 (an example of an agitating unit) and the supply roller 45. The toner supplied onto the developing roller 47 enters between the layer thickness regulation blade 49 and the developing roller 47, whereupon the toner is carried on the developing roller 47 as a thin layer of given thickness.

Surfaces of the photosensitive drums 37 are positively charged evenly by means of the electrifier 39. Subsequently, the surfaces are exposed to the laser beams L originating from the scanner section 23, whereupon electrostatic latent images corresponding to respective color images to be formed on the recording medium 7 are created.

Next, the toner carried on the developing rollers 47 is supplied to the electrostatic latent images created on the surfaces of the respective photosensitive drums 37. As a result, the electrostatic latent images of the photosensitive drums 37 are made visible as toner images of respective colors.

Subsequently, the toner images carried on the surfaces of the respective photosensitive drums 37 are sequentially transferred onto the recording mediums 7 by means of a negative transfer bias applied to transfer rollers 53 (an example of a transfer unit) during the course of the recording medium 7 conveyed by the belt 31 passing through respective transfer positions located between the photosensitive drums 37 and the corresponding transfer rollers 53. Thus, the recording medium 7 on which the toner images are transferred is conveyed to the fixing unit 27.

The fixing unit 27 conveys the recording medium 7 carrying the toner image by means of a heating roller 55 and a pressure roller 57 while heating the recording medium, thereby fixing the toner image on the recording medium 7. Subsequently, the thermally-fixed recording medium 7 is discharged onto a sheet discharging tray 63 by means of a sheet discharging roller 61.

Electrical Configuration of an Image Forming System

Figure 2:
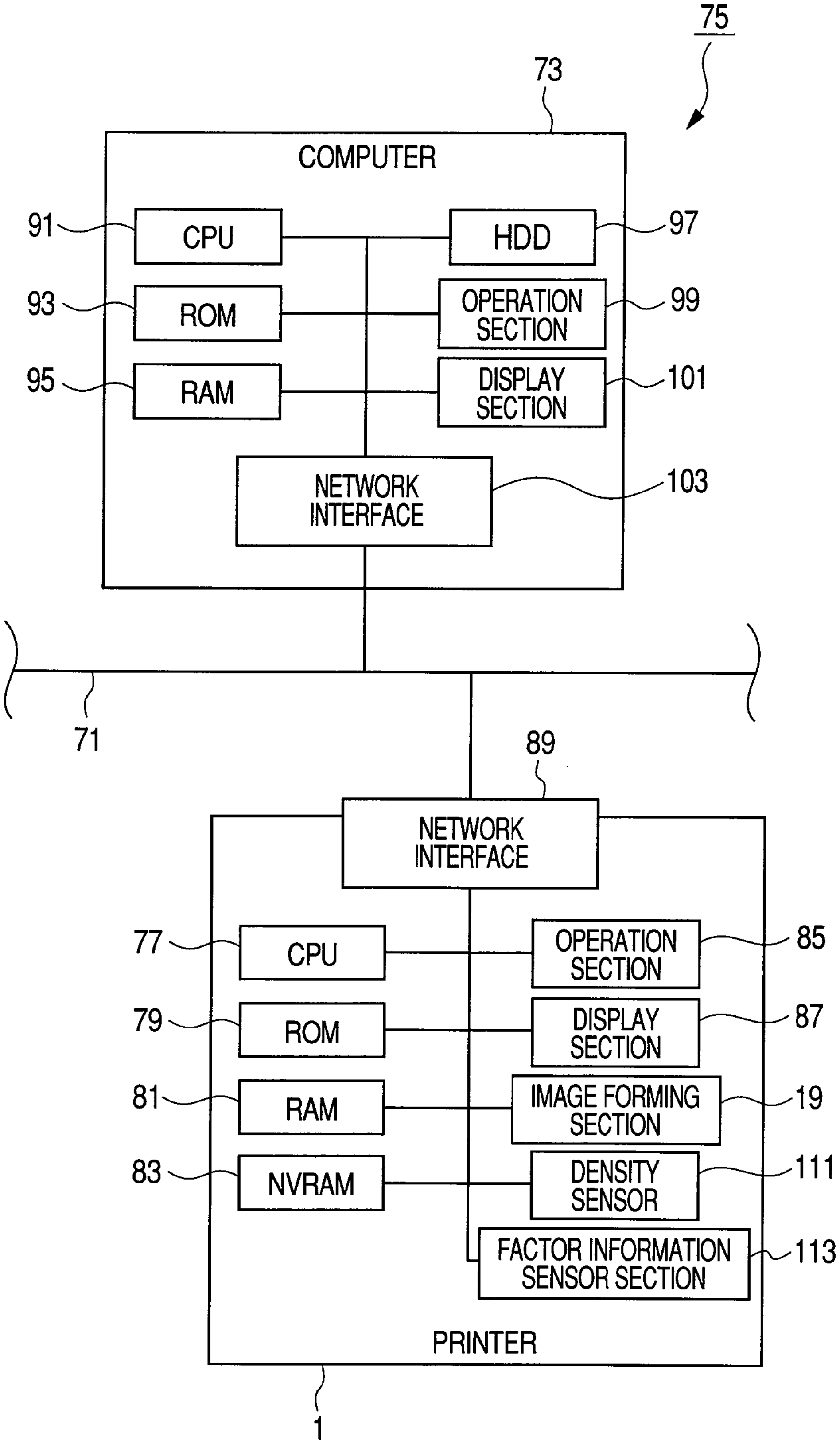
FIG. 2 is a block diagram showing an electrical configuration of an image forming system according to an exemplary embodiment of the present invention.

FIG. 2 is a block diagram showing an electrical configuration of the foregoing image forming apparatus 1 and an electrical configuration of an image forming system 75 made up of one or a plurality of computers 73 (an example of information processors) coupled to the image forming apparatus 1 by way of a communications line 71.

The image forming apparatus 1 has a central processing unit (CPU) 77, a read only memory (ROM) 79, a random access memory (RAM) 81, non-volatile random access memory (NVRAM) 83, an operation section 85, a display section 87, the previously-described image forming section 19, a network interface 89, a density sensor 111, a factor information sensor section 113, and the like.

Various programs for controlling operation of the image forming apparatus 1 are recorded in the ROM 79, and the CPU 77 controls operation of the image forming apparatus 1 in accordance with a program read from the ROM 79 while storing a result of processing into the RAM 81 or the NVRAM 83.

The operation section 85 comprises a plurality of buttons and enables various input operations to be performed such as an instruction for starting printing operation. The display section 87 comprises a liquid-crystal display and a lamp, and enables displaying of various setting screens, an operation status, and the like. The network interface 89 is coupled to an external computer 73, and the like, by way of the communications line 71, and enables mutual data communication.

The computer 73 has a CPU 91; ROM 93; RAM 95; a hard disk drive 97; an operation section 99 comprising a keyboard and a pointing device; a display section 101 comprising a liquid-crystal display or the like; a network interface 103 coupled to the communications line 71; and the like. The hard disk drive 97 stores various programs, such as application software or a driver for creating image data for printing purposes.

When a print command is input from the computer 73 by way of the operation section 99, the CPU 91 converts the image data created by the application software into a page description language (PDL) according to processing procedures of the driver and transmits the PDL to the image forming apparatus 1 by way of the network interface 103.

Calibration Processing

Upon receipt of the image from the computer 73 by way of the network interface 89, the CPU 77 of the image forming apparatus 1 creates, from the image data, color image data of respective colors, for example black, cyan, magenta, and yellow. The image data may also be document image data supplied from an unillustrated image reader coupled to the image forming apparatus 1.

The respective sets of color image data are subjected to "density correction," and drive signals generated from the thus-corrected sets of color image data are sent to the scanner section 23 of the image forming section 19.

Here, "density correction" is for reproducing a toner image whose density is faithful to the document image corresponding to the image data from the computer 73 by means of correcting the density (a gray scale) of the toner image created on the recording medium 7. Processing to be performed before performance of density correction is calibration processing.

1. Configuration for Calibration Processing

As shown in FIGS. 1 and 2, the image forming apparatus 1 is equipped with a density sensor 111 (an example of a detection unit). The density sensor 111 has a light-emitting element (for example, an infrared LED which emits an infrared ray) and a light-receiving element (for example, a photodiode). During calibration processing to be described later, the density sensor 111 emits, from the light-emitting element, light to the surface of the belt 31 on which the density patch P is formed; receives reflected light by means of the light-receiving element; and outputs an electrical signal conforming to the amount of received light (the density of the density patch P) as a toner density detection signal.

Moreover, data for forming the density patch P to be described later and a table of a correspondence between factor information and the number of marks are recorded in, for example, the NVRAM 83 (an example of a recording unit). Furthermore, during performance of calibration processing, factor information acquired at the time of performance of calibration processing, or the like, is stored in the NVRAM 83 as will be described later.

The "factor information" is information capable of causing variations in a density characteristic (a gray scale) of an image created by the image forming section 19 and comprises as follows:

(1) The Amount of Toner Used

As toner is used, toner in, e.g., the toner storage chamber 43, is depleted, whereby fluctuations arise in the density characteristic. For instance, methods for detecting the amount of toner used includes the following:

a. A method for counting the number of dots of bitmap data to which the sets of respective color image data are expanded. The method yields an advantage of being able to be implemented by means of software processing performed by the CPU 77 without use of a special sensor. The CPU 77 acts as counting means.

b. A method for detecting the amount of residual toner in the toner housing chamber 43, to thus determine the amount of toner used from a change in the residual amount. The method can be implemented by use of, e.g., a sensor (for example, an optical sensor) for detecting the amount of residual toner in the toner storage chamber 43.

c. A method for estimating the amount of toner used by means of counting the number of printed pages. The method can be implemented through use of, for example, a sensor that counts the number of the recording mediums 7 having passed through a conveyance path in the image forming apparatus 1.

(2) Temperature and Humidity

Fluctuations may arise in density characteristic as a result of a change in temperature or humidity.

(3) Elapsed Time

An elapsed time can be counted by means of, for example, a built-in timer (not shown) which is part of the image forming apparatus 1.

The factor information sensor section 113 shown in FIG. 2 comprises at least one of, for example, a residual toner amount sensor, a printed page count sensor, an employed sheet sensor, a temperature sensor, and a humidity sensor, and the CPU 77 acquires factor information obtained by the factor information sensor. Thus, the CPU 77 acts as an acquisition unit.

2. Specifics of Processing Performed by the CPU of the Image Forming Apparatus

Figure 3:
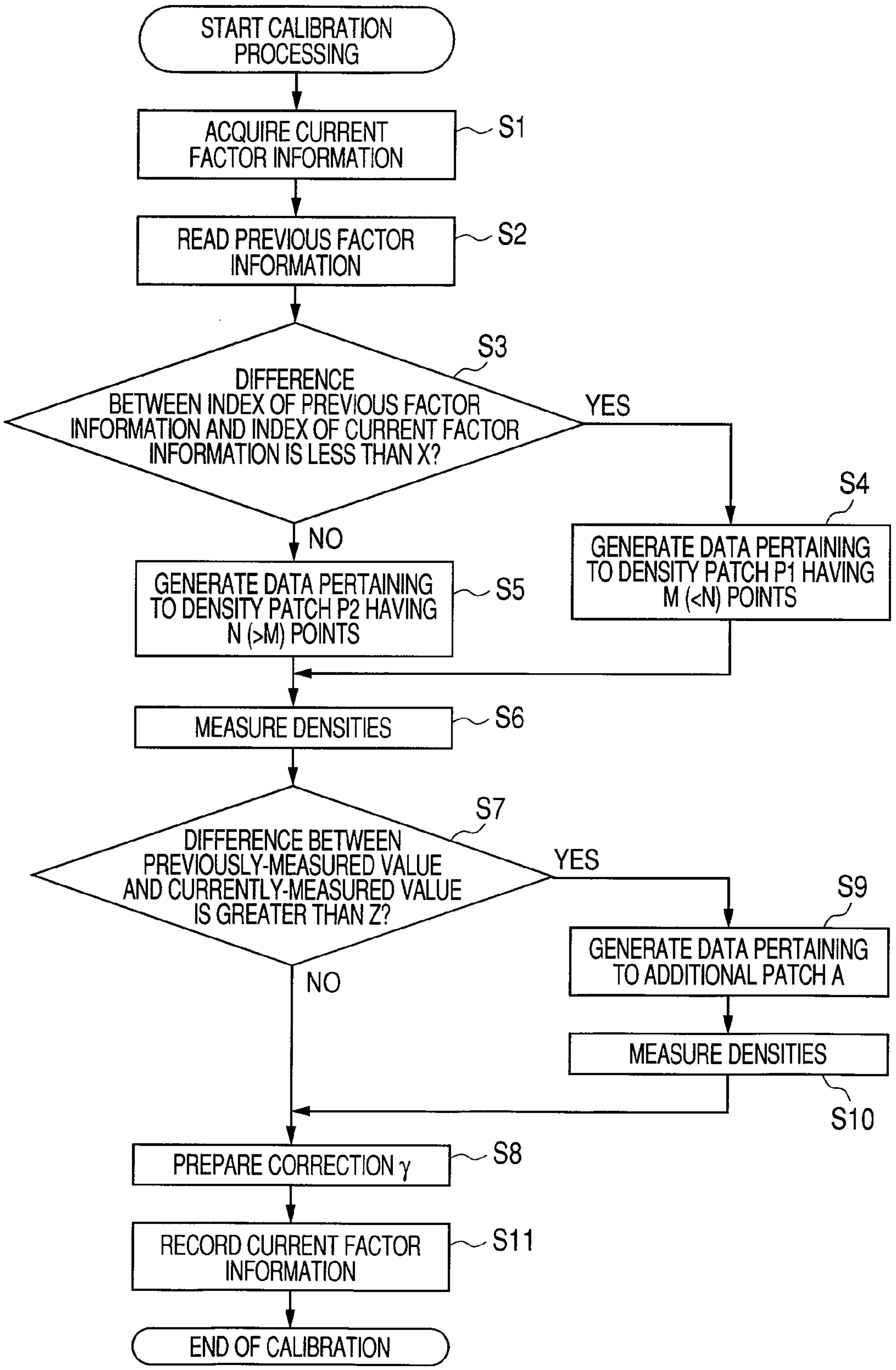
FIG. 3 is a flowchart showing calibration processing according to an exemplary embodiment of the present invention.

The CPU 77 of the image forming apparatus 1 performs calibration processing shown in FIG. 3 if any of the following conditions is fulfilled.

a. If an execution command has been issued by way of the operation section 85 of the image forming apparatus 1 or the operation section 99 of the computer 73.

b. If the number of printed recording mediums 7 (the number of prints produced since previous calibration processing was performed) has reached a specified count.

c. If power of the image forming apparatus 1 is switched from OFF to ON.

(1) Determination of the Number of Marks

After a start of calibration processing, the CPU 77 acquires current (i.e., present) factor information at operation S1; and at operation S2 reads, from the NVRAM 83, the previous factor information acquired during previous calibration processing. It is determined at operation S3 whether an index difference between an index of current factor information and an index of previous factor information is less than a threshold value X.

Specifically, for instance, in a case where the factor information corresponds to the amount of toner used, if the total amount of toner used since previous calibration processing is less than the threshold value X, variations in density characteristic are assumed to be comparatively small. On the other hand, if the total amount of toner used is equal to or greater than the threshold value X, variations in density characteristic are assumed to be comparatively large.

In a case where the factor information corresponds to a temperature or a humidity, if a difference achieved between current calibration processing and previous calibration processing in terms of a temperature or a humidity is less than the threshold value X, variations in density characteristic are assumed to be comparatively small. On the other hand, if the temperature difference or the humidity difference is equal to or greater than the threshold value X, variations in density characteristic are assumed to be comparatively large.

In a case where the factor information corresponds to an elapsed time, if a time difference between the time of previous calibration processing and a current time (i.e., a time elapsed since performance of previous calibration processing) is less than the threshold value X, variations in density characteristic are assumed to be comparatively small. On the other hand, if the time difference is equal to or greater than the threshold value X, variations in density characteristic are assumed to be comparatively large.

Accordingly, in the exemplary embodiment, the number of marks is determined on the basis of the amount of change in index of the factor information. A density patch P (an example of a pattern) whose density marks D are equal in number to the marks and differ from each other in terms of a density is formed on the belt 31 for each color. Methods for changing density comprise a pulse width modulation method (i.e., a dithering method) and a power modulation method. The pulse width modulation method is a method for changing an activation-deactivation time (a pulse width) of the laser beam L from the scanner section 23 in accordance with the density of each pixel. The power modulation method is a method for changing the intensity of the laser beam L from the scanner section 23 according to the density of each pixel or changing a development bias imparted to the developing roller 47.

Figure 4:
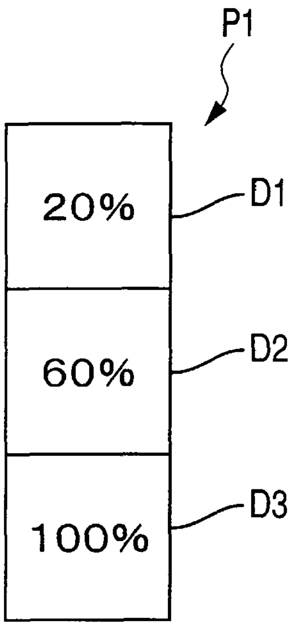
FIG. 4 is a diagrammatic view showing a simple density patch according to an exemplary embodiment of the present invention.

If the index difference of the factor information is less than the threshold value X (YES at S3), variations in density characteristic are assumed to be comparatively small. Hence, a density is detected by means of a density patch P1 having a smaller number of points for measuring a density. Specifically, data pertaining to the density patch P1 having density marks D including densities of points M are generated at operation S4, and the thus-generated data are delivered to the image forming section 19. For example, the number of points M may be three points, for example, 20%, 60%, and 100%. As shown in FIG. 4, the density patch P1 includes a density mark D1 having a density level of 20%, a density mark D2 having a density level of 60%, and a density mark D3 having a density level of 100%. It is noted that FIGS. 4 through 7 show percentage values (%) rather than graphically showing densities of the respective density marks D.

Figure 5:
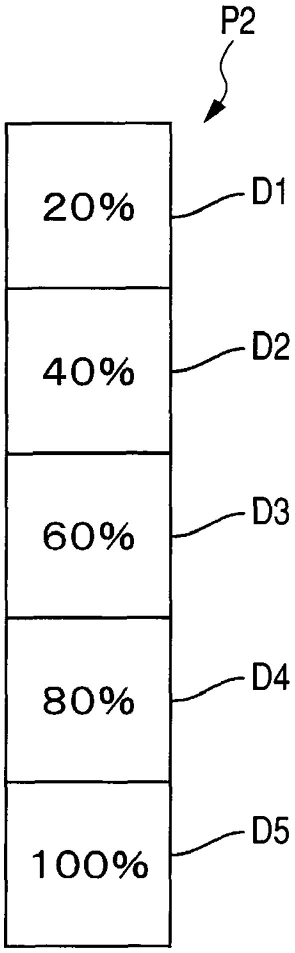
FIG. 5 is a diagrammatic view showing a detailed density patch according to an exemplary embodiment of the present invention.

On the other hand, if the index difference of factor information is equal to or greater than the threshold value X (NO at S3), variations in density characteristic are assumed to be comparatively large. Hence, a density is detected by means of a detailed density pattern P2 having a larger number of points for measuring a density. Specifically, data pertaining to the density patch P2 including density marks D having densities of points N (where N>M) are generated at operation S5, and the thus-generated data are sent to the image forming section 19. For example, the points N may include five points; for example, 20%, 40%, 60%, 80%, and 100%. As shown in FIG. 5, the density patch P2 comprises a density mark D1 having a density level of 20%, a density mark D2 having a density level of 40%, a density mark D3 having a density level of 60%, a density mark D4 having a density level of 80%, and a density mark D5 having a density level of 100%. The CPU 77 acts as a determination unit and a control unit.

Subsequently, the image forming section 19 forms a density patch P1 or a density patch P2 on the belt 31 for each color, and the density sensor 111 detects the density (a gray scale) of each density mark of the density patch P1 or P2. The CPU 77 acquires a result of detection (operation S6). The density sensor 111 and the CPU 77 act as a detection unit.

Figure 8:
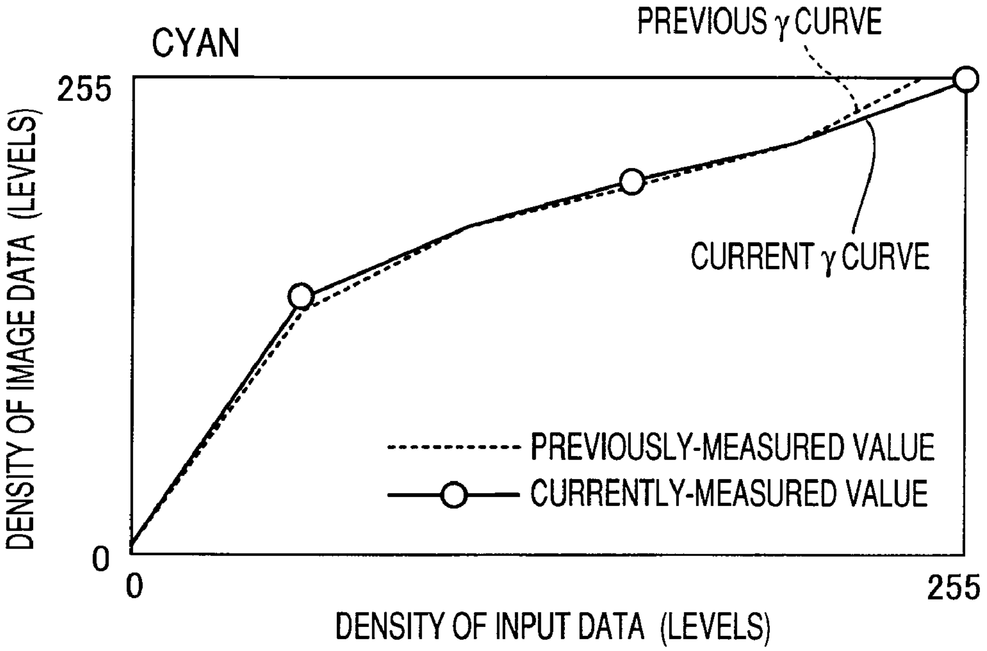
FIG. 8 is a graph showing a γ curve of cyan according to an exemplary embodiment of the present invention.
Figure 9:
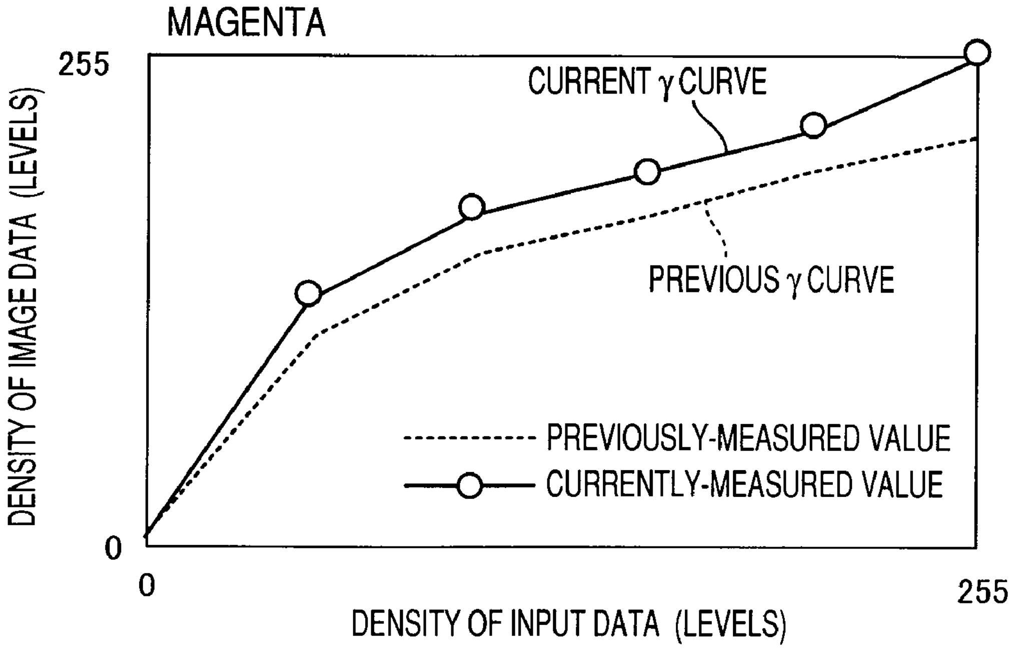
FIG. 9 is a graph showing a γ curve of magenta according to an exemplary embodiment of the present invention.
Figure 10:
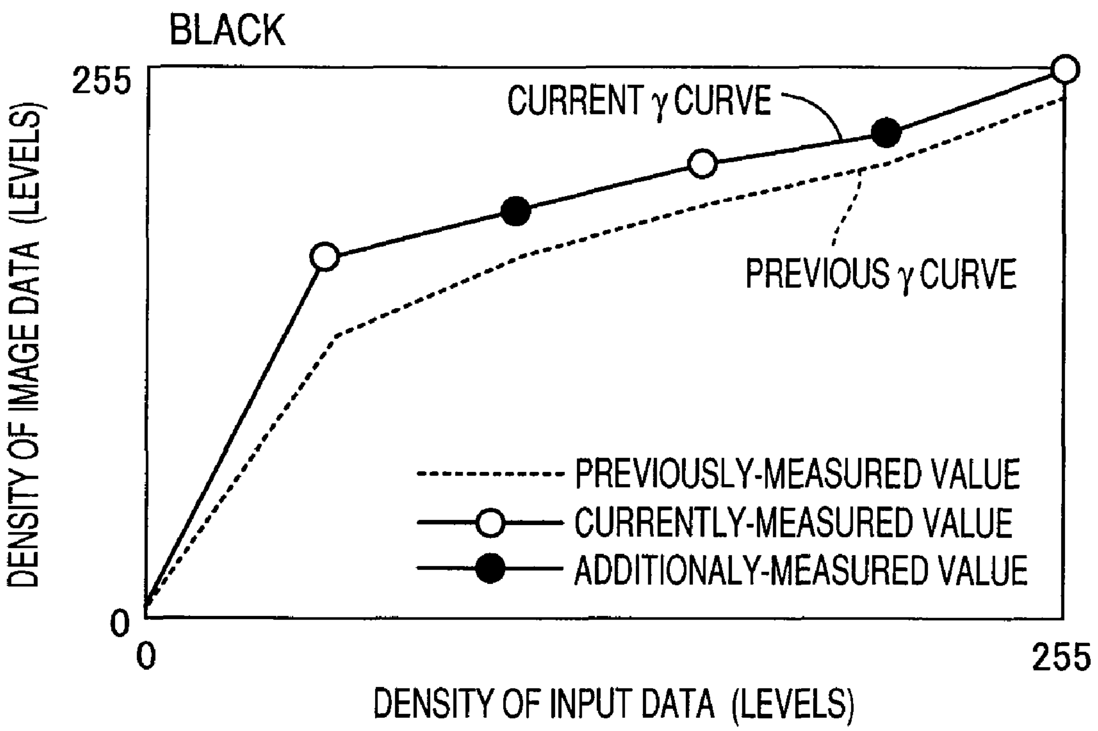
FIG. 10 is a graph showing a γ curve of black according to an exemplary embodiment of the present invention.

FIGS. 8 through 10 are graphs showing γ (gradation correction) curve data created during previous calibration processing and density levels measuring during current calibration processing. A γ curve serves as a reference for subjecting input image data from the computer 73, or the like, to density correction. A horizontal axis represents the density of input image data, and a vertical axis represents the density of image data whose density has been corrected. The gradation of density of each color is expressed by, for example, 256 levels (8 bits).

FIG. 8 is an example graph of cyan. Assuming that the amount of cyan toner used since previous calibration processing as an index difference is small in this example, densities are detected this time at three points of measurement of the density patch P1 (indicated by outlined circles in the drawing). FIG. 9 is an example graph of magenta. Assuming that, for instance, the amount of magenta toner used since previous calibration processing as an index difference is large in this example, densities are detected this time at five points of measurement (indicted by outlined circles in the drawing) of the density patch P2.

FIG. 10 is an example graph of black. Assuming that the amount of black toner used since previous calibration processing as an index difference is small, densities are detected this time at three points of measurement (indicated by outlined circles in the drawing) of the density patch P1.

(2) Determination as to Whether or not an Additional Patch is Present

The CPU 77 compares the γ curve achieved during previous calibration processing with a curve (hereinafter called a "current γ curve") defined by interconnecting points of the current density measurement. More specifically, it is determined whether a difference between the previously-measured value and the currently-measured value is equal to or greater than a threshold value Z. A difference between a previously-measured value and a currently-measured value achieved at each of the points of measurement is mentioned as an example "difference between the previously-measured value and the currently-measured value." The difference may also be the maximum value or an average value of a difference between previously-measured value and the currently-measured value, which is acquired at each of the points of measurement. Moreover, the difference may also be the amount of difference between an approximate line determined from a previous γ curve and an approximate line determined from a current γ curve. When a difference between the previously-measured value and the currently-measured value is equal to or less than the threshold value Z (No at S7), at operation S8 there is performed a correction for taking the current γ curve as a γ curve to be used for subsequent image formation processing. Another correction method is a method for taking, for example, the previous γ curve, which has been corrected in accordance with the difference between the previously-measured value and a currently-measured value, as a γ curve to be used for subsequent image formation processing. The CPU 77 acts as a correction unit and a decision unit.

Figure 6:
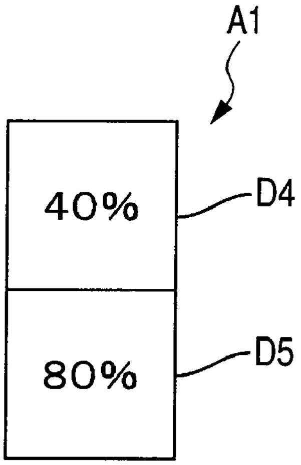
FIG. 6 is a diagrammatic view showing an additional patch according to an exemplary embodiment of the present invention.
Figure 7:
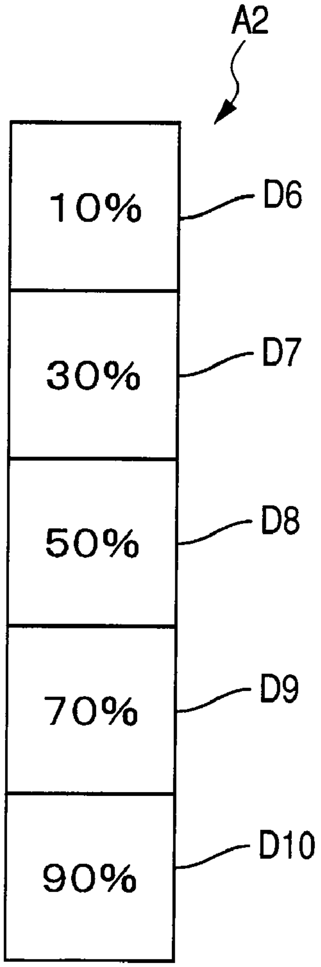
FIG. 7 is a diagrammatic view showing the additional patch according to an exemplary embodiment of the present invention.

On the other hand, if the difference between the previously-measured value and the currently-measured value is greater than the threshold value Z (YES at S7), data pertaining to an additional patch A are generated at operation S9, and the thus-generated data are delivered to the image forming section 19. The additional patch A comprises density marks D differing from the density marks D included in the density patches P1 or P2 generated at operation S4 or operation S5, respectively. For instance, when data pertaining to the density patch P1 including density marks D1, D2, and D3 of three points, 20%, 60%, and 100%, respectively are generated at operation S4, data pertaining to a density patch A1 having density marks D4 and D5 of two points; for example, 40% and 80%, are generated at operation S9 as shown in FIG. 6. In the case of, for example, black, points of measurement (indicated by outlined circles in FIG. 10), where a difference between a previously-measured value and a currently-measured value is greater than the threshold value Z, are present, and hence two points of measurement 40% and 80% (indicated by solid circles in FIG. 10) are added to the density patch P3.

In the meantime, when data pertaining to the density patch P2 including density marks D1-D5 of five points; 20%, 40%, 60%, 80%, and 100%, have already been generated at operation S5, it may not be advantageous to generate marks at the additional densities of the additional patch A1, because these density marks were already included in density patch P2. However, it may be advantageous to adopt a configuration in which data pertaining to the additional patch A2 (illustrated in FIG. 7) including density marks D6-D10 of points such as for example 10%, 30%, 50%, 70%, and 90% are generated at operation S9, in which case the thus-generated data are delivered to the image forming section 19. A result of detection of densities of the additional patch A1 or A2 performed by the density sensor 111 is acquired at operation S10, and a current γ curve is again prepared at operation S8 from measured values pertaining to the density patch P1 or P2 and measured values pertaining to the additional patch A1 or A2. A correction is made so as to take a current γ curve as a γ curve used for subsequent image formation processing. Another correction method is a method for taking, for example, the previous γ curve, which has been corrected in accordance with the difference between a previously-measured value and a currently-measured value, as a γ curve to be used for subsequent image formation processing.

Current factor information is recorded in the NVRAM 83 at operation S11, and calibration processing is ended.

Effects of the Exemplary Embodiment

According to the exemplary embodiment, points for measuring densities are changed in accordance with factor information, such as the amount of toner used. Specifically, the number of density marks conforming to the circumstance is determined in consideration of the degree of variations in density, and hence a density can be corrected with superior efficiency. For example, if there is a possibility of great changes having arisen in density, densities can be measured by use of a pattern having an appropriate number of marks conforming to the variations in density rather than measurement of densities involving indiscriminate use of a simple pattern as in the case of the related art technique.

In the exemplary embodiment, current densities are corrected by means of taking, as a reference, a result of correction (a γ curve) made during previous calibration processing (during formation of a pattern). Hence, to this end, it is advantageous to determine the number of marks in accordance with a difference between an index of the factor information acquired during previous calibration processing and an index of the factor information acquired during current calibration processing.

A determination as to whether the additional patch A1 or A2 is used is made for each of the four colors. For instance, the additional patch A1 or A2 is not formed for magenta or cyan, but rather the additional patch A1 is formed only for black, thereby increasing the number of points for measuring densities. Such a configuration enables performance of flexible density correction in accordance with a density variation characteristic of each color.

Moreover, the additional patch A1 or A2 is formed from the density marks D whose densities differ from the density marks of the already-formed density patch P1 or P2. As a result, overlapped formation of the density marks D of the same densities between the density patch P1 or P2 and the additional patch A1 or A2 can be prevented.

Additional Exemplary Embodiments

The present inventive concept is not limited to the exemplary embodiment explained by means of the above descriptions and by reference to the drawings, and, for instance, additional exemplary embodiments such as those provided below also fall within the technical scope of the present invention.

(1) In the above-described exemplary embodiment, the "target" (on which the pattern is to be created) is the belt 31 for conveying a recording medium. However, the target may also be the recording medium 7 (a sheet material such as a sheet or an over head projector (OHP) sheet) conveyed by the belt 31. Moreover, the target may also be an intermediate transfer belt directly carrying a developing-agent image created on an image carrier, so long as the image forming apparatus adopts an intermediate transfer system.

(2) The exemplary embodiment described above adopts a configuration in which the number of marks is determined in accordance with any one of the plurality of pieces of factor information. However, according to another exemplary embodiment, there may also be adopted a configuration in which marks are determined by means of a combination of two or more pieces of factor information (e.g., a temperature and a humidity, a temperature and the amount of toner used, temperature, humidity, and an amount of toner, and the like). Alternatively, one or a plurality of pieces of factor information used in determining the number of marks may also be selected from a plurality of pieces of factor information by way of the operation section 99 of the computer 73 or the operation section 85 of the image forming apparatus 1.

(3) The exemplary embodiment described above adopts a configuration in which the number of marks of the density patch P1 or P2 is selectively determined as three or five, respectively. However, there may also be adopted a configuration in which the number of marks is determined as a value (e.g., 0, 1, 2, 3, 4, 5, . . . ) conforming to (or essentially proportional to) an amount of change in the index of the factor information. Likewise, the number of marks of additional patches A1 or A2 may also be determined as a value (e.g., 0, 1, 2, 3, 4, 5, . . . ) conforming to (or essentially proportional to) a difference between a previously-measured value and a currently-measured value. Alternatively, depending on factor information, the number of marks may also be reduced as the number of pieces of factor information increases.

(4) In the exemplary embodiment described above, the phrase "amount of change in an index of factor information" denotes a difference between the factor information achieved during previous calibration processing and factor information achieved during current calibration processing. However, according to another exemplary embodiment, the amount may also refer to, for example, a difference between factor information achieved during several previous calibration processing and factor information achieved during current calibration processing. Alternatively, when toner is replaced, the amount may be a difference between factor information achieved at the time of replacement of toner and factor information achieved during current calibration processing. Moreover, there may also be adopted a configuration in which the number of marks is determined not in accordance with the amount of change in an index of factor information but in accordance with, for instance, information about a result of a determination as to whether or not factor information is equal to or greater than a threshold value.

(5) The exemplary embodiment described above adopts a configuration in which the image forming apparatus 1 is provided with an acquisition unit, a counting unit, a detection unit, a determination unit, a control unit, a correction unit, and a decision unit. However, the present inventive concept is not limited to this configuration, and there may also be adopted a configuration in which the computer 73 is provided with some or all of the acquisition unit, the determination unit, the control unit, the correction unit, the decision unit, and the factor information sensor section 113 (e.g., a temperature sensor and a humidity sensor). For instance, the CPU 91 of the computer 73 may also acquire factor information, to thus determine the number of marks; and send the image forming apparatus 1 data pertaining to a pattern having density marks equal in number to the marks. Moreover, the image forming apparatus 1 may also send the computer 73 a result of detection performed by the detection unit, and the CPU 91 of the computer 73 may also send image data having undergone density correction processing to the image forming apparatus 1. In addition, the CPU 91 may also determine whether or not an additional pattern is formed in accordance with a result of detection performed by the detection unit, which is sent from the image forming apparatus 1; and may send the data pertaining to the additional pattern to the image forming apparatus 1 when the additional pattern needs to be formed.

(6) Although the exemplary embodiment above was described and illustrated with reference to a color laser printer of direct transfer type as an example of an image forming apparatus, the present inventive concept can also be applied to a laser printer of, for instance, an intermediate transfer type. In addition, the present invention can also be applied to an inkjet printer. Moreover, the present invention may also be applied to a monochrome printer having a coloring agent of only one color, a two-color printer, a three-color printer, or a printer of five color or more.

(7) In the exemplary embodiment described above, the density patch P1 has three points 20%, 60%, and 100%. However, points of measurement where large density variations are previously known to arise may also be taken as a patch. For example, large density variations exist around 20% to 40%. Therefore, for instance, the three points may also be included in priority in a density patch, in this case, 20%, 30% and 40%. Points of measurement where large density variations arise can be obtained from results of tests performed for respective colors.

(8) The exemplary embodiment described above adopts a configuration in which a determination as to whether the additional patch A1 or A2 is present is made for each of four colors. However, when the color for which a difference between a previously-measured value and a currently-measured value is equal to or greater than the threshold value Z corresponds to one of four colors, for example black, at operation S7 shown in FIG. 3, there may also be adopted a configuration in which the additional patch A1 or A2 is formed likewise in connection with the other colors (one or a plurality of colors), to thus add a point for measuring a density.

The present invention provides illustrative non-limiting embodiments as follows:

An image forming system comprises: an image forming apparatus, and an information processing apparatus which is configured to communicate with the image forming apparatus, the image forming system comprising: a forming unit that forms an image on a target in accordance with image data; an acquisition unit that acquires factor information corresponding to a factor which is capable of causing variations in density of the image formed by the forming unit; a first determination unit that determines a number of marks in accordance with the factor information acquired by the acquisition unit; a control unit that provides the forming unit with, as the image data, data pertaining to a pattern comprising a plurality of density marks which are different from each other in density and which are equal in number to the number of marks determined by the first determination unit; a detection unit that detects a density of the image formed on the target by the forming unit in relation to the pattern; and a correction unit that corrects the density of the image in accordance with a result of detection performed by the detection unit.

The factor information may comprise an index corresponding to a change in the factor. The first determination unit may increase the number of marks as an amount of change in index increases.

The image forming system may further comprise a recording unit that records the factor information acquired by the acquisition unit when the pattern is formed. The amount of change in the index may be a difference between an index of factor information acquired during formation of a previous pattern recorded in the recording unit and an index of factor information currently acquired from the acquisition unit.

The factor information may comprise information about an amount of a coloring agent used by the forming unit.

The image forming system may comprise a counting unit that generates a count value corresponding to a number of dots of an image formed by the forming unit. The acquisition unit may acquire the amount of coloring agent in accordance with the count value.

The factor information may comprise information about at least one of a temperature, a humidity, and a time.

The forming unit may form the image by use of coloring agents of a plurality of colors. The control unit may be configured to provide, as the image data, data pertaining to patterns of each of the respective colors, to the forming unit. The first determination unit may determine the number of marks for a pattern of each color in accordance with the factor information acquired by the acquisition unit.

The image forming system may comprise: a second determination unit that determines, in accordance with a result of the detection performed by the detection unit in relation to the pattern, whether to add an additional pattern. If the second determination unit has determined to add the additional pattern, the control unit may be configured to provide the forming unit with, as the image data, data pertaining to the additional pattern comprising a plurality of additional density marks whose densities are different from densities of the plurality of density marks of the pattern. The correction unit may correct the density in accordance with a result of detection performed by the detection unit in relation to the pattern and the additional pattern.

The image forming system may comprise: a second determination unit that determines, in accordance with a result of the detection performed by the detection unit in relation to the pattern of one of the plurality of colors, whether to add additional patterns of other colors. When the second determination unit has determined to add the additional patterns of the other colors, the control unit may be configured to provide the forming unit with, as the image data, data pertaining to additional patterns of the other colors, each of the additional patterns comprising a plurality of density marks which differ in density from that of the pattern of the one of the plurality of colors. The correction unit may correct densities of the images of the other colors in accordance with a result of detection performed by the detection unit in relation to the patterns of the other colors and the additional patterns of the other colors.

The other colors may be all of the plurality of colors except the one color.

An image forming apparatus comprises: a forming unit that forms an image on a target in accordance with image data; an acquisition unit that acquires factor information corresponding to a factor which is capable of causing variations in density of the image formed by the forming unit; a first determination unit that determines a number of marks in accordance with the factor information acquired by the acquisition unit; a control unit that provides the forming unit with, as the image data, data pertaining to a pattern comprising a plurality of density marks which are different from each other in density and which are equal in number to the number of marks determined by the first determination unit; a detection unit that detects a density of the image formed on the target by the forming unit in relation to the pattern; and a correction unit that corrects the density of the image in accordance with a result of detection performed by the detection unit.

A method for correcting density of an image formed on a target comprises: acquiring factor information corresponding to a factor capable of causing variations in density of the image; determining a number of marks in accordance with the factor information; forming, on the target, an image of a pattern comprising a plurality of density marks which are equal in number to the number of marks; detecting a density of the image based on the pattern comprising the plurality of density marks; and correcting the density in based on a result of detecting the density.

According to the non-limiting, exemplary embodiments of the present invention, the number of density marks of a plurality of types in the pattern is determined in accordance with factor information capable of causing variations to the density of an image. Specifically, the number of density marks in accordance with a condition is determined in consideration of variations in density, so that efficient correction of a density can be performed.

It is advantageous that, as the amount of change in index of factor information increases, detailed density correction be performed by means of a pattern having many types of density marks.

Current density is usually corrected by means of taking a result of correction made during previous formation of a pattern as a reference. It is advantageous that the number of marks be determined in accordance with a difference between an index of factor information recorded during previous formation of a pattern and an index of currently-acquired factor information.

For instance, if the amount of coloring agent (e.g., toner or ink) used by the forming unit increases, the density of an image can vary accordingly. Therefore, the number of marks is determined in accordance with the amount of coloring agent used.

The amount of coloring agent used can be detected without provision of a sensor for optically detecting, for instance, the amount of coloring agent used.

The density of an image can vary according to a temperature, a humidity, and a time (e.g., the operating time of an image forming apparatus, and the like). Therefore, according to an exemplary embodiment of the present invention, the number of marks is determined in accordance with at least one of a temperature, a humidity, and a time.

Variations in density of an image attributable to the factor information acquired from the acquisition unit sometimes change for each color. Therefore, in such a case, individually performing processing for determining the number of marks and density correction processing on a per-color basis is advantageous.

Depending on a result of detection of a pattern created a first time, it may be advantageous that more detailed density correction be performed by means of a pattern that is larger than the initial pattern in terms of the number of marks. Therefore, when such detailed density correction is determined to be performed, an additional pattern including density marks that differ in density from those of the initial pattern is created on a target. As a result, overlapped formation of density marks of the same densities between the initial pattern and the additional pattern can be prevented.

It may also be independently determined whether or not an additional pattern of each of colors is created in accordance with a result of detection of a pattern of each color. However, there may also be a case where determining whether to create an additional pattern of another color by utilization of a result of detection of a pattern of a certain one color is more efficient.

When even one color for which detailed density correction is to be performed by formation of an additional pattern is found, it is advantageous to create additional patterns of all colors, including the other colors, and perform detailed density correction.

While the present invention has been shown and described with reference to certain exemplary embodiments thereof, it will be understood by those skilled in the art that various changes in form and details may be made therein without departing from the spirit and scope of the invention as defined by the appended claims.

What is claimed is:

1. An image forming system comprising:

an image forming apparatus, and an information processing apparatus which is configured to communicate with the image forming apparatus, the image forming system comprising:

a processor;

a forming unit that forms an image on a target in accordance with image data;

memory storing computer-readable instructions that, when executed by the processor, cause the processor to provide:

an acquisition unit that acquires factor information corresponding to a factor which is capable of causing variations in density of the image formed by the forming unit;

a first determination unit that determines a number of marks in accordance with the factor information acquired by the acquisition unit; and a control unit that provides the forming unit with, as the image data, data pertaining to a pattern comprising a plurality of density marks which are different from each other in density and which are equal in number to the number of marks determined by the first determination unit; and a detection unit that detects a density of the image formed on the target by the forming unit in relation to the pattern, wherein the memory stores additional computer-readable instructions that, when executed by the processor, further cause the processor to provide a correction unit that corrects the density of the image in accordance with a result of detection performed by the detection unit, wherein the factor information comprises an index corresponding to a change in the factor; and wherein the first determination unit increases the number of marks as an amount of change in index increases.

2. The image forming system according to claim 1, wherein the memory stores additional computer-readable instructions that, when executed by the processor, further cause the processor to provide a recording unit that records the factor information acquired by the acquisition unit when the pattern is formed, wherein the amount of change in the index is a difference between an index of factor information acquired during formation of a previous pattern recorded in the recording unit and an index of factor information currently acquired from the acquisition unit.

3. The image forming system according to claim 1, wherein the factor information comprises information about an amount of a coloring agent used by the forming unit.

4. The image forming system according to claim 3, wherein the memory stores additional computer-readable instructions that, when executed by the processor, further cause the processor to provide a counting unit that generates a count value corresponding to a number of dots of an image formed by the forming unit, wherein the acquisition unit acquires the amount of coloring agent in accordance with the count value.

5. The image forming system according to claim 1, wherein the factor information comprises information about at least one of a temperature, a humidity, and a time.

6. The image forming system according to claim 1, wherein the forming unit forms the image by use of coloring agents of a plurality of colors;

wherein the control unit is configured to provide, as the image data, data pertaining to patterns of each of the respective colors, to the forming unit; and wherein the first determination unit determines the number of marks for a pattern of each color in accordance with the factor information acquired by the acquisition unit.

7. The image forming system according to claim 1, wherein the memory stores additional computer-readable instructions that, when executed by the processor, further cause the processor to provide:

a second determination unit that determines, in accordance with a result of the detection performed by the detection unit in relation to the pattern, whether to add an additional pattern, wherein, if the second determination unit has determined to add the additional pattern, the control unit is configured to provide the forming unit with, as the image data, data pertaining to the additional pattern comprising a plurality of additional density marks whose densities are different from densities of the plurality of density marks of the pattern, and wherein the correction unit corrects the density in accordance with a result of detection performed by the detection unit in relation to the pattern and the additional pattern.

8. The image forming system according to claim 6, wherein the memory stores additional computer-readable instructions that, when executed by the processor, further cause the processor to provide:

a second determination unit that determines, in accordance with a result of the detection performed by the detection unit in relation to the pattern of one of the plurality of colors, whether to add additional patterns of other colors, wherein, when the second determination unit has determined to add the additional patterns of the other colors, the control unit is configured to provide the forming unit with, as the image data, data pertaining to the additional patterns of the other colors, each of the additional patterns comprising a plurality of density marks which differ in density from that of the pattern of the one of the plurality of colors, and wherein the correction unit corrects densities of the images of the other colors in accordance with a result of detection performed by the detection unit in relation to the patterns of the other colors and the additional patterns of the other colors.

9. The image forming system according to claim 8, wherein the other colors are all of the plurality of colors except the one color.

10. An image forming apparatus comprising:

a processor;

a forming unit that forms an image on a target in accordance with image data;

memory storing computer-readable instructions that, when executed by the processor, cause the processor to provide:

an acquisition unit that acquires factor information corresponding to a factor which is capable of causing variations in density of the image formed by the forming unit;

a first determination unit that determines a number of marks in accordance with the factor information acquired by the acquisition unit; and a control unit that provides the forming unit with, as the image data, data pertaining to a pattern comprising a plurality of density marks which are different from each other in density and which are equal in number to the number of marks determined by the first determination unit; and a detection unit that detects a density of the image formed on the target by the forming unit in relation to the pattern, wherein the memory stores additional computer-readable instructions that, when executed by the processor, further cause the processor to provide a correction unit that corrects the density of the image in accordance with a result of detection performed by the detection unit, wherein the factor information comprises an index corresponding to a change in the factor, and wherein the first determination unit increases the number of marks as an amount of change in index increases.

11. A method for correcting density of an image formed on a target, the method comprising:

acquiring factor information corresponding to a factor capable of causing variations in density of the image, the factor information comprising an index corresponding to a change in the factor;

determining a number of marks in accordance with the factor information, wherein the determined number of marks increases as an amount of change in index increases;

forming, on the target, an image of a pattern comprising a plurality of density marks which are equal in number to the number of marks;

detecting a density of the image based on the pattern comprising the plurality of density marks; and correcting the density based on a result of detecting the density.

12. The image forming system according to claim 1, wherein the factor information comprises a difference between at least one of a current temperature, humidity, or time and a temperature, humidity, or time acquired when the density is corrected by the correction unit by forming the density marks previously.

13. The image forming system according to claim 1, wherein the factor information comprises at least one of a temperature, a humidity, and a time, and wherein the first determination unit determines the number of marks in accordance with the at least one of the temperature, the humidity, and the time acquired by the acquisition unit.

14. The image forming system according to claim 1, wherein the forming unit forms the pattern on a belt on which a recording medium is transported or a belt on which an image to be transferred to a recording medium is formed.

15. The method of claim 11, wherein the factor information comprises a difference between at least one of a current temperature, humidity, or time and a temperature, humidity, or time acquired when the density was corrected previously.

16. At least one non-transitory computer-readable medium having computer-executable instructions stored thereon that, when executed, cause at least one computing device to:

acquire factor information corresponding to a factor capable of causing variations in density of the image, the factor information comprising an index corresponding to a change in the factor;

determine a number of marks in accordance with the factor information, wherein the determined number of marks increases as an amount of change in index increases;

form, on the target, an image of a pattern comprising a plurality of density marks which are equal in number to the number of marks;

detect a density of the image based on the pattern comprising the plurality of density marks; and correct the density based on a result of detecting the density.

17. The at least one non-transitory computer-readable medium of claim 16, wherein the factor information comprises a difference between at least one of a current temperature, humidity, or time and a temperature, humidity, or time acquired when the density was corrected previously.

18. The at least one non-transitory computer-readable medium of claim 16, wherein the factor information comprises at least one of a temperature, a humidity, and a time, and wherein the number of marks is determined in accordance with the at least one of the temperature, the humidity, and the time.

19. The at least one non-transitory computer-readable medium of claim 16, wherein pattern is formed on a belt on which a recording medium is transported or a belt on which an image to be transferred to a recording medium is formed.

* * * * *